United States Patent [19]
Guo et al.

[11] Patent Number: 5,763,010
[45] Date of Patent: Jun. 9, 1998

[54] THERMAL POST-DEPOSITION TREATMENT OF HALOGEN-DOPED FILMS TO IMPROVE FILM STABILITY AND REDUCE HALOGEN MIGRATION TO INTERCONNECT LAYERS

[75] Inventors: Ted Guo, Palo Alto; Barney M. Cohen, Santa Clara, both of Calif.; Amrita Verma, Pittsburgh, Pa.

[73] Assignee: Applied Materials, Inc., Santa Clara, Calif.

[21] Appl. No.: 646,862

[22] Filed: May 8, 1996

[51] Int. Cl.⁶ .................. B05D 3/02; B05D 1/36; H05H 1/24
[52] U.S. Cl. .............. 427/376.2; 427/578; 427/404; 427/419.2; 438/530; 438/697
[58] Field of Search .................. 427/376.2, 578, 427/404, 419.2; 437/247, 248, 240; 438/530, 697

[56] References Cited

U.S. PATENT DOCUMENTS

| | | | |
|---|---|---|---|
| 4,952,423 | 8/1990 | Hirata et al. | 427/110 |
| 4,960,656 | 10/1990 | Chang et al. | |
| 5,045,346 | 9/1991 | Tabasky et al. | |
| 5,204,138 | 4/1993 | Nguyen et al. | |
| 5,275,977 | 1/1994 | Otsubo et al. | |
| 5,380,567 | 1/1995 | Haluska | |
| 5,385,763 | 1/1995 | Okano et al. | |
| 5,399,529 | 3/1995 | Homma | |
| 5,405,805 | 4/1995 | Homma | |
| 5,407,529 | 4/1995 | Homma | |

OTHER PUBLICATIONS

L. Q. Qian, et al., "High Density Plasma Deposition and Deep Submicron Gap Fill with Low Dielectric Constant SiOf Films," (1995), DUMIC Conference, pp. 50–56.

R. K. Laxman, "Low ε Dielectrics: CVD Fluorinated Silicon Dioxides," May (1995), Semiconductor International., pp. 71–74.

D. Carl, et al., "The Effect of $O_2:C_2F_6$ Ratios and Low Frequency Power on the Gap Fill Properties and Stability of F–TEOS Films," (1995), DUMIC Conference, pp. 234–240. *abstract*.

S. Takeishi, et al., "Stabilizing Dielectric Constants of Fluorine–Doped–$SiO_2$ Films by N2O–plasma Annealing," (1995), DUMIC Conference, pp. 257–259.

C. Falcony, et al., "High Quality, High Deposition Rate $SiO_2$ Films at Low Temperatures Using Silicon Fluorides and Plasma Assisted Deposition Techniques," (1993), J. Vac. Sci. Technol. A 11(6), pp. 2945–2949.

*Primary Examiner*—Michael Lusignan
*Assistant Examiner*—Bret Chen
*Attorney, Agent, or Firm*—Townsend and Townsend and Crew LLP

[57] ABSTRACT

A method of stabilizing a halogen-doped silicon oxide film to reduce halogen atoms migrating from said film during subsequent processing steps. A halogen-doped film is deposited over a substrate and then subjected to a degassing step in which the film is briefly heated to a temperature of between about 300° and 550° C. before deposition of a diffusion barrier layer. It is believed that such a heat treatment step removes loosely bonded halogen atoms from the halogen-doped film and thus the treatment is referred to as a degassing step. In a preferred version of this embodiment, the halogen-doped silicon oxide film is an FSG film that is subjected to a degassing treatment for between about 35 and 50 seconds.

18 Claims, 9 Drawing Sheets

5,763,010

THERMAL POST-DEPOSITION TREATMENT OF HALOGEN-DOPED FILMS TO IMPROVE FILM STABILITY AND REDUCE HALOGEN MIGRATION TO INTERCONNECT LAYERS

BACKGROUND OF THE INVENTION

The present invention relates to the deposition of thin film layers during wafer processing. More specifically, the present invention relates to a method and apparatus for treating a halogen-doped dielectric layer to prevent the halogen atoms from migrating into an adjacent layer during subsequent processing steps. The method of the present invention may find use in a variety of different process recipes and is particularly useful in preventing fluorine from outgassing into and/or through titanium layers which are often used in barrier layers between adjacent silicon oxide and metal layers.

As feature sizes have become smaller and multilevel metallization commonplace in integrated circuits, low dielectric constant films have become increasingly important. Low dielectric constant films are particularly desirable for intermetal dielectric (IMD) layers to reduce the RC time delay of the interconnect metallization being covered, to prevent crosstalk between the different levels of metallization, and to reduce device power consumption.

Many approaches to lower dielectric constants have been proposed. One of the more promising solutions is the incorporation of fluorine or other halogen elements such as chlorine or bromine into a silicon oxide layer. An example of halogen incorporation is described in U.S. Ser. No. 08/344,283 commonly assigned to Applied Materials, Inc. filed on Nov. 24, 1994 and incorporated herein by reference.

Fluorine, the preferred halogen dopant for silicon oxide films, lowers the dielectric constant of the silicon oxide film because fluorine is an electronegative atom that decreases the polarizability of the overall SiOF network. Fluorine-doped silicon oxide films are referred to as fluorosilicate glass films or FSG for short.

In addition to decreasing the dielectric constant, incorporating fluorine in silicon oxide layers also helps solve common problems encountered in fabricating smaller geometry devices, such as filling closely spaced gaps between metal or polysilicon lines deposited over semiconductor structures. It is believed that because fluorine is an etching species, the introduction of fluorine during deposition of a silicon oxide film introduces an etching effect on the growing film. The simultaneous deposition/etching effect allows FSG films to have improved gap-filling capabilities such that the films are able to adequately cover adjacent metal layers having an aspect ratio of 1.8 or more.

Thus, manufacturers desire to include fluorine in various dielectric layers and particularly in intermetal dielectric layers. A problem with the incorporation of fluorine and other halogen dopants in silicon oxide or similar films, however, has been keeping the fluorine or halogen element in the film. Experiments have shown that fluorine atoms are often loosely bound in the SiF network.

One problem that is a concern to those in the semiconductor industry is the diffusion of materials between adjacent layers in semiconductor devices. Such diffusion or intermixing may be prevented by sandwiching another material or stack of materials between the layers. The role of this third material or stack of materials is to prevent or retard the diffusion of the two materials into each other and hence the layer is often referred to as a diffusion barrier.

Diffusion barriers play a prominent role in the formation of multilevel metal structures which are present in many integrated circuits. Such multilevel metal structures form a high-conductivity, thin-film network fabricated above the silicon surface to connect various active devices through specific electrical paths. During the formation of metal-to-metal and metal-to-silicon contact structures in this thin-film network, openings are etched in the silicon oxide or similar dielectric layer that separates the substrate or underlying conductive thin film from the overlying conductive thin film. A conductive material such as aluminum or another metal is then used to fill the opening and make a connection to the silicon substrate or underlying conductive thin film. Ideally, the impedance to current flow between the silicon and overlying connecting metal layer or between the underlying and overlying connecting metal layers should be as low as possible.

Titanium is commonly used in diffusion barrier layers between a silicon oxide layer and an adjacent metal layer such as an aluminum layer. Depending on the application, such a diffusion barrier layer may be a single titanium layer, a titanium/titanium nitride stack or a similar layer. In a titanium/titanium nitride stack, the titanium nitride film is deposited over an initial titanium layer. The titanium layer provides good adhesion between the silicon oxide and the titanium nitride layers and also provides an additional barrier as a $TiO_x$ ($\sim TiO_2$) layer. When used as a diffusion barrier layer or as part of a diffusion barrier stack, the titanium layer is commonly deposited over the silicon oxide layer after openings for contact structures (contacts or vias) have been etched in the film. Titanium adheres well to silicon oxide and forms good ohmic contacts to aluminum or other metal layers. Titanium also has good step coverage characteristics and thus adheres well to the sidewalls of the etched contact openings. A titanium layer adjacent to an aluminum layer reacts with aluminum to form a $TiAl_3$ layer at the titanium/aluminum interface.

Loosely bound fluorine atoms in the SiF network can penetrate a layer such as a titanium layer and degrade overlying metal lines. In particular, the loosely bonded fluorine atoms tend to outgas or migrate into adjacent layers when subject to high temperatures present during subsequent process steps. It is believed that the migrating fluorine atoms react with titanium from the titanium layer to form TiF and also react with aluminum from the aluminum and $TiAl_3$ layers to form $AlF_3$.

The presence of TiF and/or $AlF_3$ increases the resistance of the contact structure and weakens the titanium/silicon oxide and titanium/aluminum interfaces to a point where they may peel off during subsequent processing.

From the discussion above, it can be seen that low dielectric constant films such as halogen-doped silicon oxide or FSG are desirable to use as intermetal dielectric layers. It can also be seen that a method is needed to prevent migration of the fluorine or other halogen atoms into adjacent diffusion barrier and metal layers.

Heat treatment steps in which a wafer is heated to a specified temperature for a specified time are employed for various reasons during substrate processing. For example, anneal steps are sometimes used to repair damage to a substrate after an ion implantation step or other processing step. Also, a brief heat treatment step has been employed to force absorbed water out of a layer such as a silicon oxide layer. The water degassing step is sometimes performed before deposition of an overlying diffusion barrier or metal layer to prevent the absorbed water from reacting with those layers during subsequent processing. As an example of this type of heat treatment step, a wafer may be heated to a temperature of about 400° C. for a period of 40 seconds. After completion of this heat treatment step, diffusion barrier layers and/or metal layers are deposited over the silicon oxide layer. Heat treatment steps have not been used to stabilize FSG or other halogen-doped layers.

SUMMARY OF THE INVENTION

The present invention solves the above problems of the prior art by providing a halogen-doped silicon oxide film that is resistant to outgassing of halogen atoms and thus has reduced halogen migration into adjacent diffusion barrier or metal layers. The present invention also provides a method and apparatus for forming such a halogen-doped silicon oxide film.

In one embodiment of the present invention, a halogen-doped silicon oxide film is deposited over a substrate and then subjected to a step in which the film is briefly heated to a temperature of between about 300° and 550° C. before deposition of a diffusion barrier layer. It is believed that this heat treatment step removes loosely bonded halogen atoms from the halogen-doped film, and thus the treatment is referred to as a degassing step. In a preferred version of this embodiment, the halogen-doped silicon oxide film is an FSG film that is subjected to a degassing treatment for between about 35 and 50 seconds.

These and other embodiments of the present invention along with many of its advantages and features are described in more detail in conjunction with the text below and attached figures.

DETAILED DESCRIPTION OF THE PREFERRED EMBODIMENTS

I. Exemplary PECVD System

Figure 1:
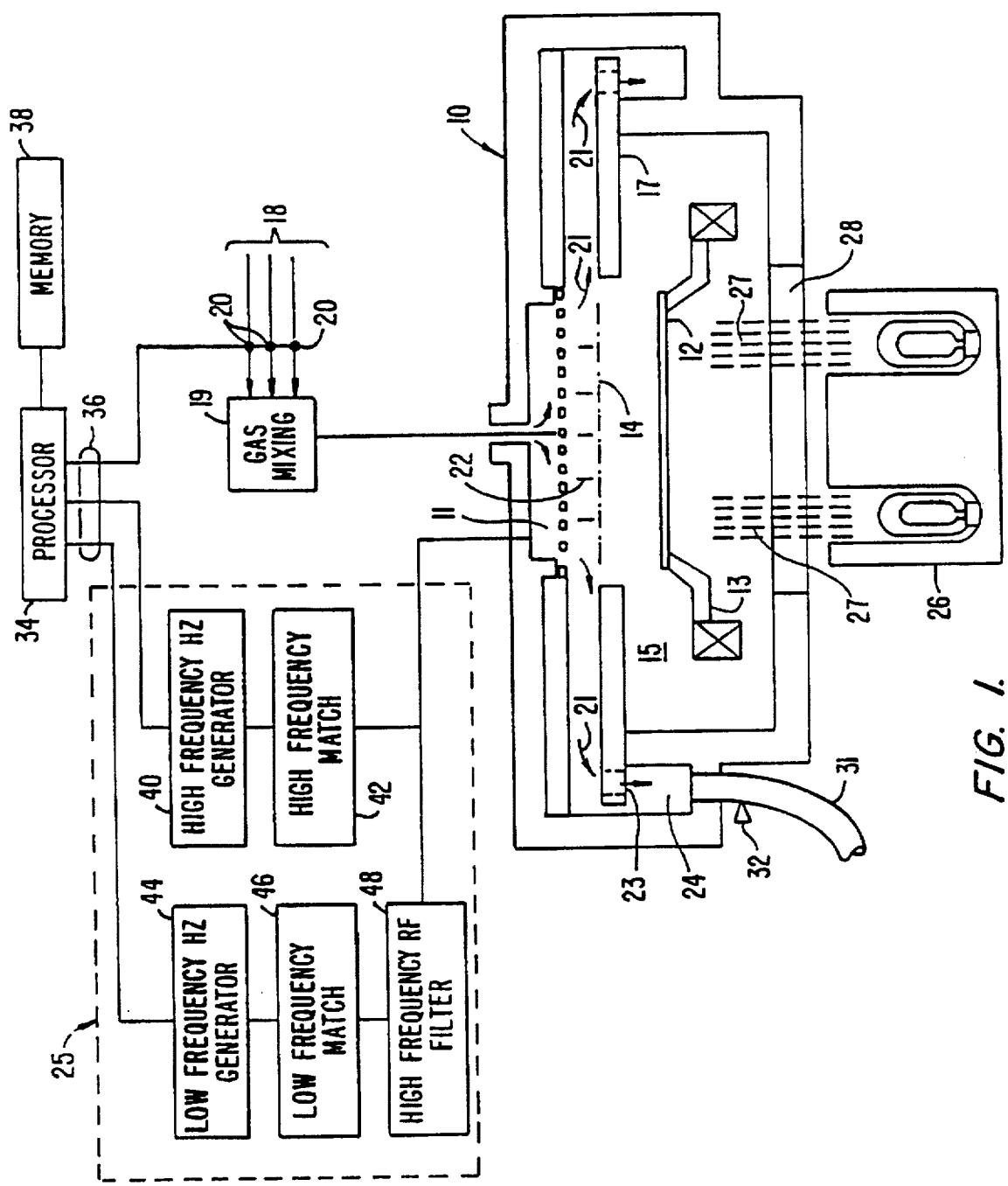
FIG. 1 illustrates one embodiment of a simplified chemical vapor deposition apparatus according to the present invention.

FIG. 1 illustrates one embodiment of a simplified, parallel-plate plasma enhanced chemical vapor deposition (PECVD) system 10 having a vacuum chamber 15 in which a halogen-doped layer can be deposited and subjected to the degassing step according to the method of the present invention. Optionally, chamber 15 may be part of a cluster tool system as described more fully in respect to FIG. 2. As part of such a cluster tool system, a halogen-doped layer may be deposited in chamber 15 and then moved under vacuum conditions to a separate chamber to be subjected to the degassing step of the present invention.

PECVD system 10 contains a gas distribution manifold 11 for dispersing deposition gases to a wafer, not shown, that rests on a susceptor 12. Susceptor 12 is highly thermally responsive and is mounted on support fingers 13 so that susceptor 12 (and the wafer supported on the upper surface of susceptor 12) can be controllably moved between a lower loading/off-loading position and an upper processing position 14 which is closely adjacent to manifold 11.

When susceptor 12 and the wafer are in processing position 14, they are surrounded by a baffle plate 17 having a plurality of spaced holes 23 which exhaust into an annular vacuum manifold 24. Deposition and carrier gases are supplied through gas lines 18 into a mixing chamber 19 where they are combined and then sent to manifold 11. During processing, gas supplied to manifold 11 is uniformly distributed radially across the surface of the wafer as indicated by arrows 21. The gas is then exhausted via ports 23 into the circular vacuum manifold 24 and out an exhaust line 31 by a vacuum pump system (not shown). The rate at which gases are released through exhaust line 31 is controlled by a throttle valve 32.

A controlled plasma is formed adjacent to the wafer by RF energy applied to manifold 11 from RF power supply 25. Gas distribution manifold 11 is also an RF electrode, while susceptor 12 is grounded. RF power supply 25 can supply either single- or mixed-frequency RF power (or other desired variations) to manifold 11 to enhance the decomposition of reactive species introduced into chamber 15. Mixed-frequency RF power is generated by a high-frequency (e.g., 13.56 MHz) RF generator 40 and corresponding match circuit 42 and a low-frequency (e.g., 350 KHz) RF generator 44 and corresponding match circuit 46. A high-frequency filter 48 prevents voltage generated by high-frequency generator 40 from damaging the low-frequency generator.

A circular external lamp module 26 provides a collimated annular pattern of light 27 through quartz window 28 onto an annular outer peripheral portion of susceptor 12. Such heat distribution compensates for the natural heat loss pattern of the susceptor and provides rapid thermal heating and uniform susceptor and wafer heating for effecting deposition.

A motor, not shown, raises and lowers susceptor 12 between a processing position 14 and a lower wafer-loading position. The motor, gas supply valves connected to gas lines 18, throttle valve 32 and RF power supply 25 are controlled by a processor 34 over control lines 36 of which only some are shown. Processor 34 operates under the control of a computer program stored in a computer-readable medium such as a memory 38. The computer program dictates the timing, mixture of gases, chamber pressure, chamber temperature, RF power levels, susceptor position, and other parameters of a particular process.

Typically, any or all of the chamber lining, gas inlet manifold faceplate, support fingers 13, and various other reactor hardware is fabricated from material such as aluminum or anodized aluminum. An example of such a PECVD apparatus is described in U.S. Pat. No. 5,000,113 entitled "Thermal CVD/PECVD Reactor and Use for Thermal Chemical Vapor Deposition of Silicon Dioxide and In-situ Multi-step Planarized Process," which is commonly assigned and is hereby incorporated by reference.

Figure 2:
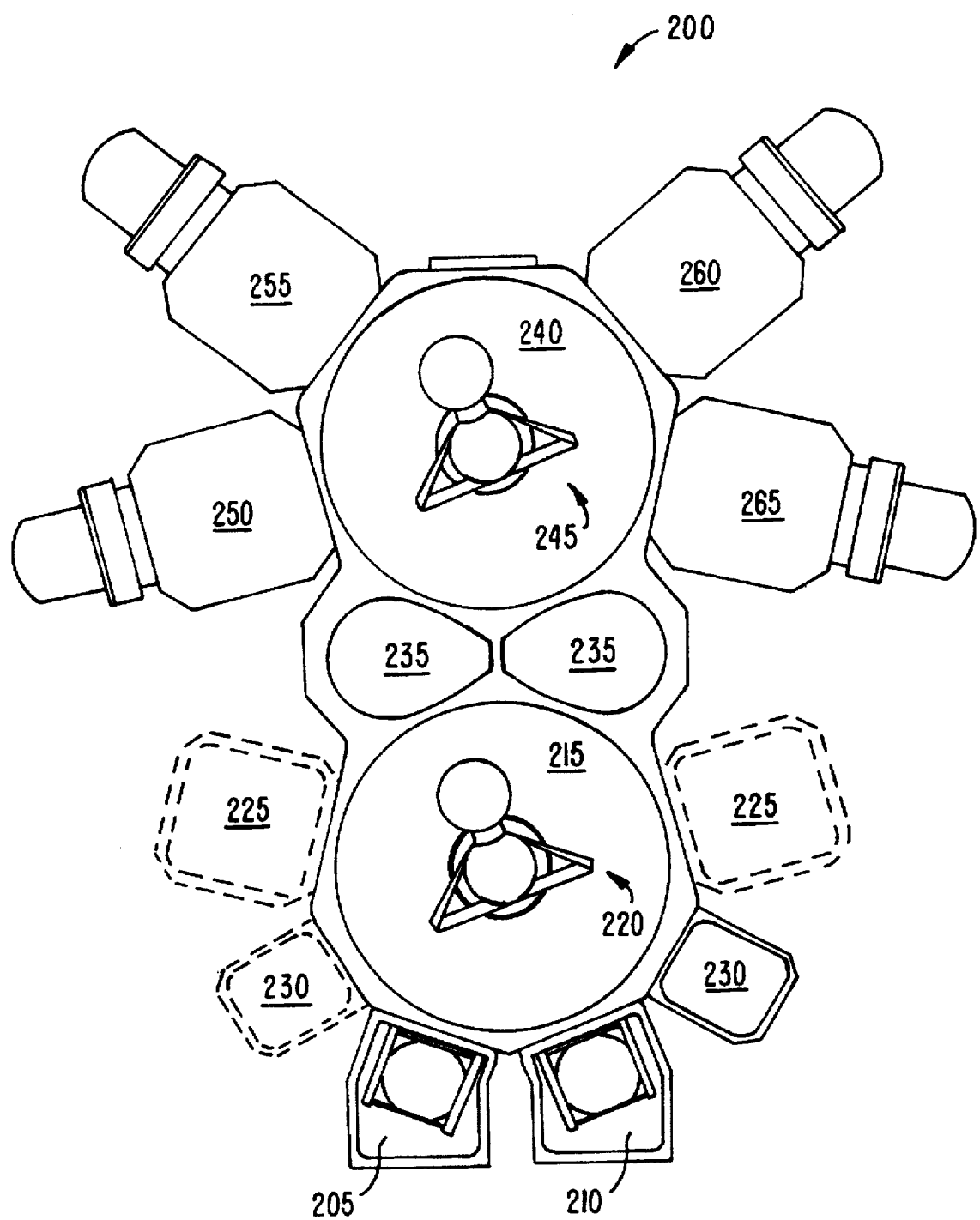
FIG. 2 illustrates one embodiment of a simplified cluster tool substrate processing system that may be used to practice the method of the present invention.

Chamber 15 may be part of a cluster tool system in which multiple substrate processing chambers are situated around and served by a central robot. An example of such a cluster tool system is shown in FIG. 2. In FIG. 2, a cluster tool system 200 includes vacuum load-lock chambers 205 and 210. Load-lock chambers 205 and 210 maintain vacuum conditions within inner chamber 215 while substrates enter and exit system 200. A robot 220 serves substrates from/to load-lock chambers 205 and 210 to substrate processing chambers 225 and heating chambers 230. Processing chambers 225 can be outfitted to perform a number of substrate processing operations such as CVD, etch or the like. Heating chambers 230 can be used in heat treatment steps such as anneal steps and, in certain embodiments of the present invention, may also be used to heat a substrate during the degassing step of the present invention.

Pass-through chambers 235 are used to maintain ultra-high vacuum conditions in inner chamber 240 while allowing substrates to be transferred from robot 215 to a robot 245. Robot 245 serves substrates from pass-through chambers 235 to substrate processing chambers 250 to 265. Similar to processing chambers 225, processing chambers 250 to 265 can be outfitted to perform a variety of substrate processing operations. In one instance, processing chamber 250 is outfitted to sputter deposit a titanium layer; processing chamber 255 is outfitted to sputter deposit a titanium nitride layer and processing chamber is outfitted to sputter deposit an aluminum layer.

During operation, substrates are brought to vacuum load-lock chambers 205 and 210 by a conveyor belt or robot system (not shown) that operates under the control of computer program executed by processor 34. Also, robots 220 and 245 operate under control of the computer program executing on processor 34 to transfer substrates between the various processing chambers of cluster tool 200.

The above system and cluster tool system descriptions are mainly for illustrative purposes, and other plasma CVD equipment such as electron cyclotron resonance (ECR) plasma CVD devices, induction-coupled RF high-density plasma CVD devices, or the like may be employed. Additionally, variations of the above-described system such as variations in susceptor design, heater design, RF power frequencies, location of RF power connections and others are possible. For example, the wafer could be supported and heated by a resistively heated susceptor. Additionally, thermal CVD equipment may also be used for formation of the halogen-doped bulk film layer. The layer and method for forming such a layer of the present invention are not limited to any specific apparatus or to any specific plasma excitation method.

II. Exemplary Fluorosilicate Glass Deposition

In each embodiment of the process of the present invention, the halogen-doped silicon oxide layer may be formed using any of many different processes for such films. Three FSG film processes, one using triethoxyfluorosilane (hereinafter referred to as "TEFS") as a fluorine source, one using $C_2F_6$ as a fluorine source, and one using $SiF_4$ as a fluorine source, are set forth below to serve as examples.

The exemplary process recipes may be performed in PECVD system 10. Those of ordinary skill in the art will understand that other processes and other CVD system types may also be used to deposit the FSG films. The steps involved in the formation of the exemplary FSG films are set forth in the flowchart of FIG. 3 and discussed in detail below. For convenience and reference some of the steps discussed with respect to FIG. 3 include cross-reference numerals to the apparatus of FIG. 1.

Each of the exemplary processes details moving a substrate into a chamber, introducing various process gases into the chamber, controlling the temperature and pressure within the chamber and forming a plasma by application of RF energy. All such steps are performed under the control of processor 34, which, as previously stated, executes a computer program stored in a computer-readable medium in memory 38. For example, the substrate is moved into the processing chamber in response to a particular set of such computer instructions being executed by processor 34. Similar sets of computer instructions are executed by processor 34 to control the heater, vacuum system, gas distribution system and other elements of the substrate processing system to carry out required processing steps.

Additionally, the rate at which various gases and other dopant sources are introduced in the exemplary processes are all based on a process performed in a lamp-heated DCVD chamber outfitted for 200 mm wafers that is part of a P5000 deposition system manufactured by Applied Materials. These values are dependent in part on chamber volume and will vary when the exemplary processes are practiced in other chambers having larger or smaller volumes.

A. TEFS-FSG Film Deposition

Figure 3:
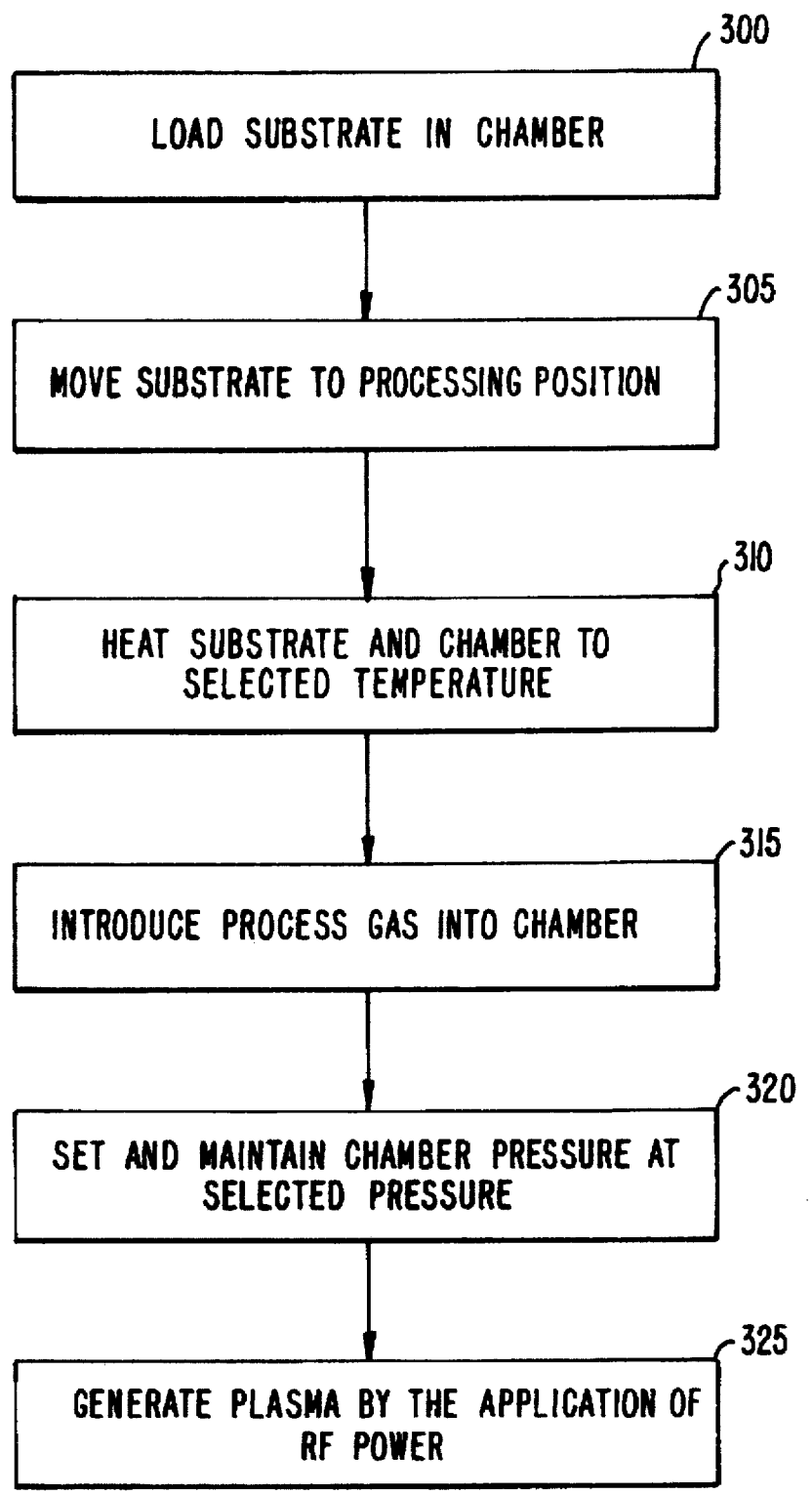
FIG. 3 is a flowchart illustrating steps undertaken in formation of an exemplary FSG layer that may be treated according to the method of the present invention to prevent fluorine migration.

To form the exemplary TEFS-FSG film, the wafer being processed is loaded in vacuum chamber 15 through a vacuum-lock door onto susceptor 12 (FIG. 3, step 300). Susceptor 12 is then moved into processing position 14 (step 305). In processing position 14, the wafer is generally positioned between 200–600 mils from gas distribution manifold 11. Preferably, the wafer is positioned between about 200–350 mils from the gas distribution manifold. Such spacing confines the reactant gases between the wafer and manifold, thereby increasing reaction efficiency and deposition rate. Such spacing also helps confine the deposition of material to the surface of the wafer.

Once the wafer is positioned for processing, the exemplary TEFS-FSG film is deposited by heating the wafer and susceptor to a temperature of between 200°–500° C., and maintaining this temperature range throughout the deposition (step 310). Preferably, the wafer and susceptor are heated to a temperature within the range of 350°–500° C., and most preferably to a temperature of about 400 degrees.

A gaseous mixture (process gas) comprising TEFS as a source of fluorine, tetraethoxysilane (hereinafter referred to as "TEOS") as the source of silicon, and one or more gaseous sources of oxygen is then introduced into the gas mixing chamber through the gas distribution system under control of processor 34 (step 315).

Being liquids, the TEFS and TEOS sources are vaporized and combined with an inert carrier gas such as helium before being introduced into the gas mixing chamber. TEFS is introduced into a bubbler, liquid injection valve or the like at a rate of between about 400–1500 mgm. The actual rate selected depends in part on the desired fluorine concentration of the deposited FSG film. Similarly, TEOS is introduced into a bubbler, liquid injection valve or the like at a rate of between about 400–1500 mgm and preferably at a rate of about 600 mgm. The vaporized TEOS and TEFS gases are each mixed with a helium carrier gas flow introduced into the chamber at a rate of between 400–1500 sccm. Oxygen is also introduced into the gas mixing chamber in the form of $O_2$ at a flow rate of between about 400–1000 sccm and is preferably introduced at a flow rate of about 700 sccm. The total gas flow into the gas mixing chamber and through the gas distribution manifold is between about 1000 and 2000 sccm. Preferably the total gas flow is between about 1200 and 1600 sccm.

The pressure within the reaction chamber is set to a selected pressure of between about 1–50 torr. This pressure is maintained in the reaction chamber throughout deposition by throttle valve 32 in conjunction with the vacuum pump system and the introduction of the gaseous mixture (step 320). Preferably, the selected pressure is maintained within the range of about 3–16 torr and most preferably at about 5 torr.

The process gas flows from the gas mixing chamber through the gas distribution manifold and into the reaction chamber where it is excited into a plasma state (step 325) to effect deposition. The plasma is formed using a high radio frequency of between 13–14 MHz (preferably 13.56 MHz) powered at between 0–900 Watts, and preferably between about 120–250 Watts, and a low radio frequency of 350 KHz at between about 0–900 Watts and preferably at about 230 Watts.

B. $C_2F_6$-FSG Film Deposition

To form the exemplary $C_2F_6$-FSG film, the wafer is loaded onto susceptor 12 in vacuum chamber 15 through a vacuum-lock door (FIG. 3, step 300). The susceptor is then moved into processing position 14 (step 305). In processing position 14, the wafer is positioned between about 200–600 mils from gas distribution manifold 11. Preferably, the wafer is positioned between about 200–350 mils from the gas distribution manifold.

Once properly positioned, the exemplary $C_2F_6$-FSG film is deposited on the wafer by heating the wafer and susceptor to a temperature of between 200°–500° C., preferably to a temperature within the range of 350°–500° C. and most preferably to about 400 degrees, and maintaining this temperature range throughout the deposition (step 310). A gaseous mixture comprising $CF_6$ as a gaseous source of fluorine, TEOS as a source of silicon, and one or more gaseous sources of oxygen is then introduced into the reaction chamber (step 315) from the gas distribution manifold.

The TEOS source is first vaporized and then combined with an inert carrier gas such as helium. TEOS is introduced at a rate between about 400°–1500 mgm and is preferably introduced at about 600 mgm. After being vaporized, the TEOS gas source then is mixed with a helium carrier gas which is introduced at a rate of between 400–1500 sccm and is preferably introduced at a rate of about 760 sccm. In other embodiments, TEOS may be introduced through a bubbler. $C_2F_6$ is introduced at a flow rate of between 100–900 sccm. The actual rate selected depends in part on the desired fluorine concentration of the deposited FSG film. Oxygen in the form of $O_2$ is introduced at a rate of between about 400–1000 sccm and preferably at a rate of about 700 sccm. The total gas flow into the gas mixing chamber and through the gas distribution manifold is between about 1000 and 2000 sccm and is preferably between about 1200 and 1600 sccm.

A selected pressure of between about 1–50 torr is set and maintained in the reaction chamber throughout deposition by throttle valve 32 in conjunction with the vacuum pump system and the introduction of the gaseous mixture (step 320). Preferably, the selected pressure is within the range of about 3–16 torr, and most preferably is about 5 torr.

After processing conditions are set, a plasma is formed (step 325). The plasma is formed using a high radio frequency of 13.56 MHz at between 0–900 Watts, and preferably at about 200 Watts, and a low radio frequency of 350 KHz at between about 0–900 Watts and preferably at about 430 Watts.

C. $SiF_4$-FSG Film Deposition

To form the exemplary $SiF_4$-FSG film, the wafer is loaded onto susceptor 12 in vacuum chamber 15 through a vacuum-lock door (FIG. 3, step 300). The susceptor is then moved into processing position 14 (step 305). In processing position 14, the wafer is positioned between about 200–600 mils from gas distribution manifold 11. Preferably, the wafer is positioned between about 200–350 mils from the gas distribution manifold.

Once the wafer is properly positioned, the exemplary $SiF_4$-FSG bulk film is deposited by heating the wafer and susceptor to a temperature of between 200°–500° C., preferably to a temperature within the range of 350°–500° C. and most preferably to about 400 degrees, and maintaining this temperature range throughout the deposition (step 310).

A gaseous mixture comprising $SiF_4$ as a gaseous source of fluorine, TEOS as a source of silicon, and one or more gaseous sources of oxygen is then introduced into the reaction chamber from the gas distribution manifold (step 315).

The TEOS is vaporized and then combined with an inert carrier gas such as helium. TEOS is introduced at a rate between about 400–1500 mgm and is preferably introduced at about 600 mgm. TEOS is mixed with a helium carrier gas introduced at a rate of between 400–1500 sccm. $SiF_4$ is introduced at a flow rate of between 100–1450 sccm. The actual rate selected depends in part on the desired fluorine concentration of the deposited FSG film. Oxygen in the form of $O_2$ is introduced at a rate of between about 400–1000 sccm and preferably at a rate of about 700 sccm. The total gas flow into the gas mixing chamber and through the gas distribution manifold is between about 1000 and 2000 sccm and is preferably between about 1200 and 1600 sccm.

A selected pressure of between about 1–50 torr is set and maintained in the reaction chamber throughout deposition by throttle valve 32 in conjunction with the vacuum pump system and the introduction of the gaseous mixture (step 320). Preferably, the selected pressure is within the range of about 3–16 torr, and most preferably is about 5 torr.

After processing conditions are set, a plasma is formed (step 325). The plasma is formed using a high radio frequency of between about 13–14 MHz (preferably 13.56 MHz) driven at between 0–900 Watts, and a low radio frequency of 350 KHz at between about 0–900 Watts. Preferably, the power for the high frequency is about 110 Watts and the power for the low frequency is about 340 Watts.

The parameters in the above recipes should not limit the claims as described herein. One of ordinary skill in the art can also use other chemicals, chamber parameters, and conditions to produce similar films.

The present invention is also applicable to silicon oxide films doped with members of the halogen family other than fluorine, such as chlorine or bromine. Such films may be deposited, for example, from a plasma of oxygen, TEOS and a reagent from the class of haloorganosilanes of the formula $SiX_nR_{4-n}$ where n is an integer in the range of 1–3, X is a halogen, and each R is either a hydrogen or an alkoxy group with the proviso that at least one R is an alkoxy group as described in U.S. Ser. No. 08/344,283 mentioned above. Such films may also be deposited by other known methods as understood by one of ordinary skill in the art.

III. Halogen Migration in Halogen-Doped Silicon Oxide Films

Experiments have shown that when subjected to an anneal step, the resistivity of a titanium layer overlying certain FSG films increases more than does the resistivity of such a layer overlying an undoped silicate glass film. It is believed that the difference in increased resistance can be attributed to the migration of fluorine atoms from the FSG layer to and through the titanium layer. In the experiments, a 400 Å titanium layer was deposited over both undoped silicon oxide films and fluorine-doped silicon oxide films (2.0% $C_2F_6$-FSG films—as measured by Fourier transform infrared (FTIR) spectroscopy of the peak area ratio of SiF bonds to SiF+SiO bonds) at 250° C. The undoped silicon oxide films and FSG films were both 1.0 micron thick. Deposition conditions for each film are listed below in Table 1.

TABLE 1

| | DEPOSITION CONDITIONS | |
|---|---|---|
| PARAMETER | USG FILM | FSG FILM |
| Temperature | 400° C. | 400° C. |
| Pressure | 5 torr | 5 torr |
| Spacing | 300 mils | 275 mils |
| TEOS Flow | 560 sccm | 760 sccm |
| $O_2$ Flow | 840 sccm | 700 sccm |
| $C_2F_6$ Flow | N/A | 250 sccm |
| High Frequency RF Supply | 13.56 MHz @ 375 Watts | 13.56 MHz @ 200 Watts |
| Low Frequency RF Supply | 350 KHz @ 75 Watts | 350 KHz @ 430 Watts |

After deposition of the titanium layer, the resistivity of the titanium film was measured by a four-point probe as understood by a person of ordinary skill in the art. The films were then subjected to an anneal step where the wafers were heated to a temperature of 550° C. for 2 minutes. The resistivity of the titanium film was then measured again, after the anneal step. The results of these measurements are listed in Table 2 below.

TABLE 2

SHEET RESISTIVITY OF Ti ON $C_2F_6$-FSG BEFORE AND AFTER ANNEAL

| Film Type | Ti Deposition | Pre Anneal Sheet Res. (Ω/□) | Anneal | Post Anneal Sheet Res. (Ω/□) |
|---|---|---|---|---|
| Thermal Oxide | 400 Å | 17.3 | 550° C. | 42.2 |
| Thermal Oxide | 500 Å | 17.4 | 550° C. | 41.5 |
| 2.0% $C_2F_6$-FSG | 400 Å | 17.1 | 550° C. | 51.6 |
| 2.0% $C_2F_6$-FSG | 400 Å | 17.1 | 550° C. | 46.3 |

As illustrated in Table 2, there was no significant difference in the sheet resistivity of the FSG and silicon oxide wafers before the anneal step. After the anneal step, however, the sheet resistivity of the FSG wafers was between 10–20% higher than the sheet resistivity of the undoped silicon oxide wafers. It is believed that the increased resistivity is from fluorine outgassing from the FSG layer and forming $TiF_3$ in the titanium layer during the anneal step.

Figure 4:
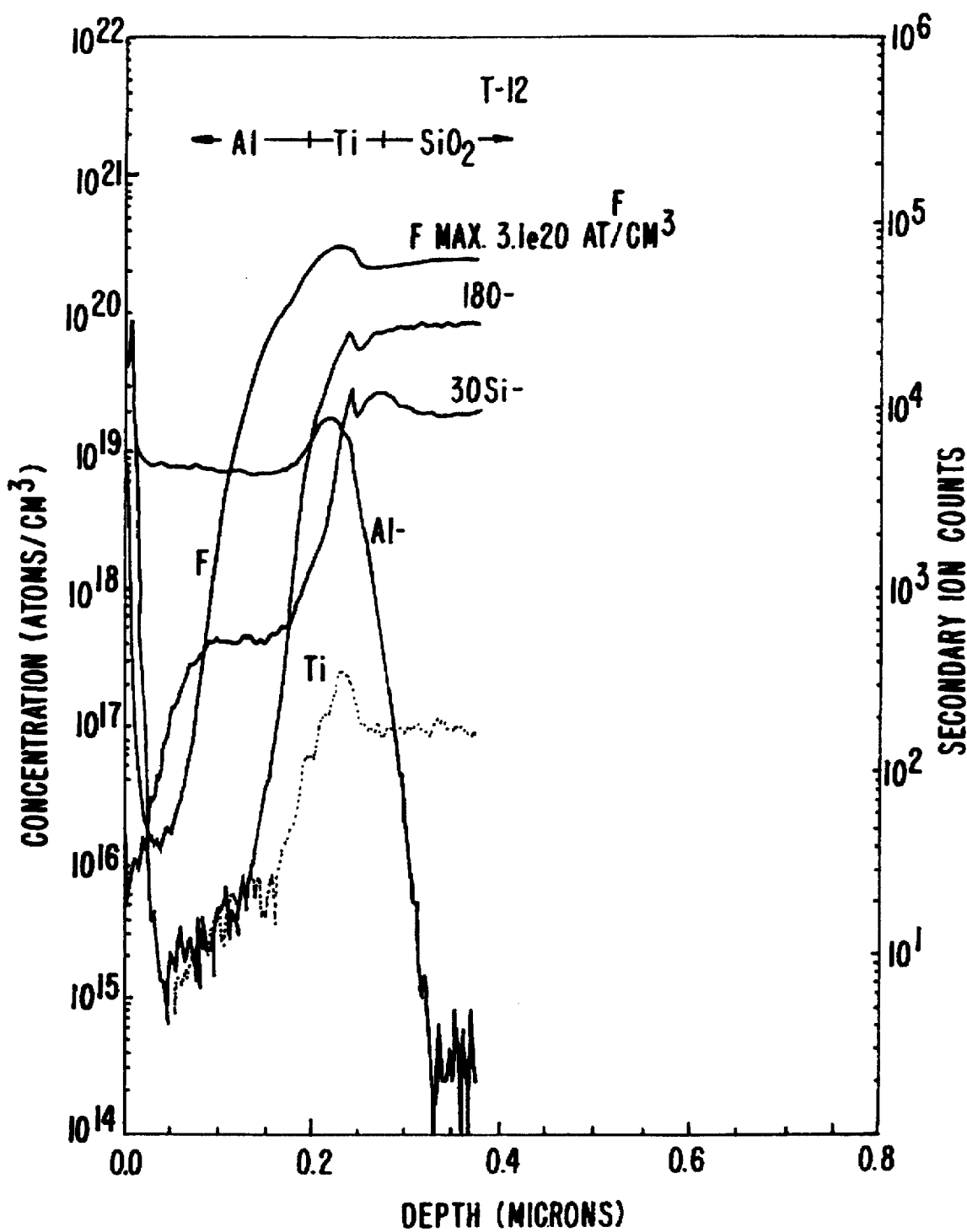
FIGS. 4 and 5 are graphs showing experimental results evidencing the migration of fluorine into adjacent layers from an FSG layer that was not treated according to the method of the present.
Figure 5:
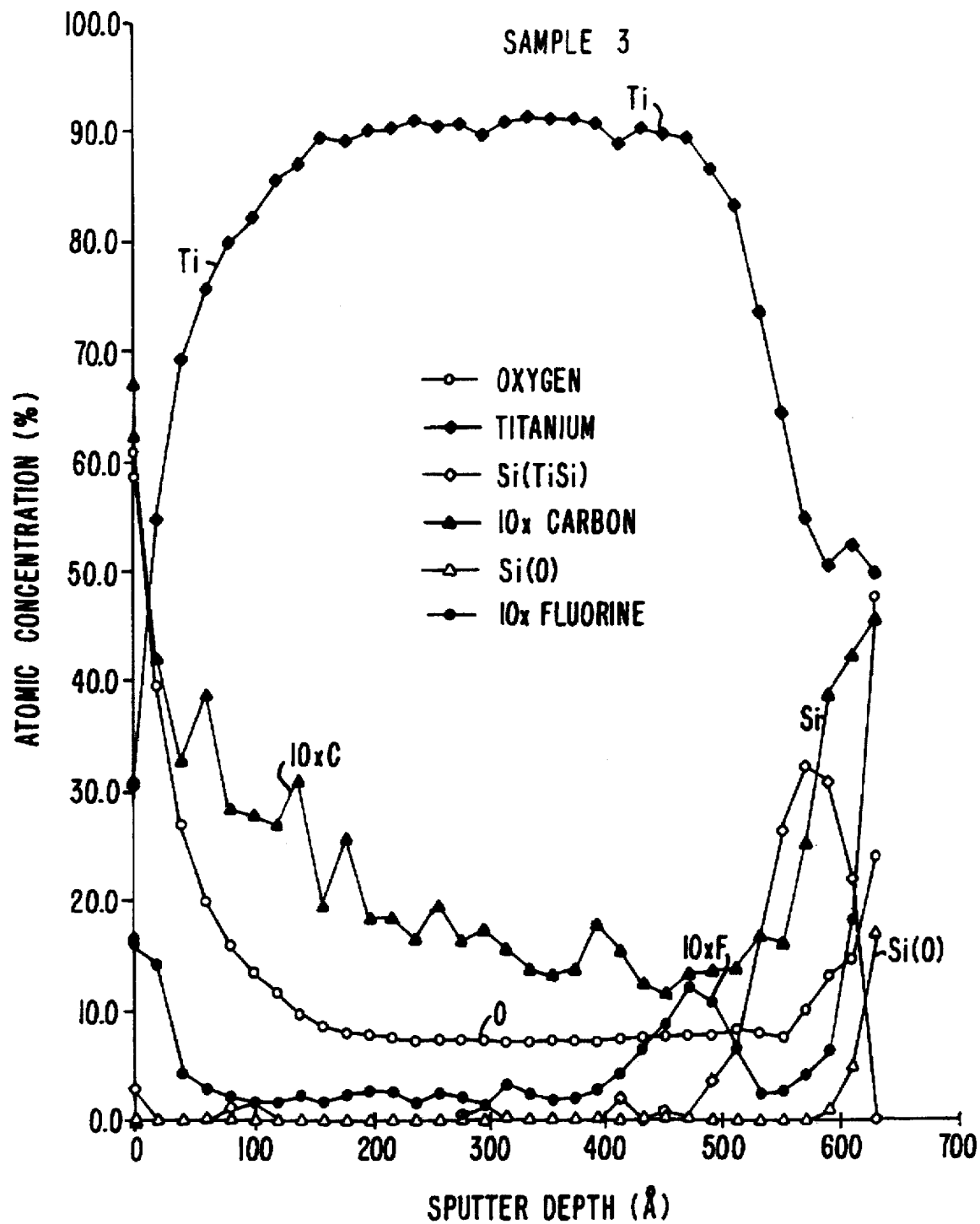

Evidence of such fluorine outgassing is illustrated in FIGS. 4 and 5. FIG. 4 is a profile of a three layer structure (an aluminum layer overlying a titanium layer overlying an FSG layer) deposited over a silicon wafer that was not treated according to the method of the present. The profile was taken using secondary ion mass spectroscopy (SIMS) techniques well known to those of ordinary skill in the art. The FSG layer was formed by the process outlined in Table 1 above.

After deposition of the layer was completed, an overlying titanium layer was deposited at 250° C. Then, an overlying aluminum layer was deposited over the titanium layer at 550 degrees to complete the structure. The approximate boundaries between the deposited layers are shown in FIG. 3. The upper 0.2 microns of the substrate contain the aluminum layer; the next 400 Å the titanium layer, and then the FSG layer. Before the SIMS measurements were taken, the structure was heated to 550° C. for 2 minutes during an anneal step.

As evident from FIG. 4, the titanium layer was not much of a barrier to fluorine diffusion. A relatively high fluorine concentration was present in the titanium layer. Additional tests showed that the fluorine concentration observed in the aluminum layer of the above-described structure was approximately two orders of magnitude greater than the fluorine concentration observed in a similar structure formed with an undoped silicate glass layer.

FIG. 5 is an Auger depth profile of a 600 Å titanium layer deposited over a 3.0% $C_2F_6$-FSG layer for a wafer that was not treated according to the method of the present invention. In FIG. 5, the fluorine concentration level is multiplied by a factor of 10. The FSG layer was deposited using the same conditions noted above in Table 1 except that the rate at which $C_2F_6$ was introduced was increased to 380 sccm. After deposition of the FSG layer and overlying titanium layer, the wafer was subjected to a 2-minute anneal at 550 degrees.

FIG. 5 shows that the concentration of fluorine near the interface of the titanium and FSG layers is significantly lower than the concentration of fluorine in the FSG layer. The fluorine concentration level increases, however, in a 100 Å bell-shaped peak near the interface. It is believed that this increase is evidence of fluorine migration into the titanium film. The bell-shaped profile of the fluorine concentration level indicates that the diffusion of fluorine into the titanium layer was enhanced by the solid solubility of fluorine in titanium. The migrated fluorine bonds with titanium to form TiF. The presence of TiF in the titanium layer increases the sheet resistivity of the titanium film after the anneal step as compared to before the anneal step. A further increase in sheet resistivity is possibly caused by titanium oxide formation due to a small diffusion of oxygen from the underlying FSG layer into the titanium layer.

IV. Decreasing Halogen Migration in Halogen-Doped Silicon Oxide Films

It is believed that loosely bonded halogen atoms in the silicon oxide lattice structure are the primary source of halogen migration. The present invention treats a halogen-doped film such as the FSG films described above to remove loosely bonded halogen atoms that may exist in the film. The loosely bonded halogen atoms are more prone to migrate outside of the halogen-doped film into adjacent layers during subsequent processing steps than strongly bonded halogen atoms. Thus, removing such loosely bonded atoms lessens the potential for halogen atom migration during subsequent processing steps, thereby improving the stability of the film and reducing degradation of adjacent metal layers. The steps described below may be performed on a halogen-doped silicon oxide layer after the layer is deposited by a process such as one of the exemplary FSG deposition processes described above.

According to the present invention, the deposited halogen-doped layer is subjected to a degassing step where the wafer is heated for a brief time to remove loosely bonded halogen atoms. The degassing step occurs before deposition of a subsequent layer such as a titanium layer.

Figure 6:
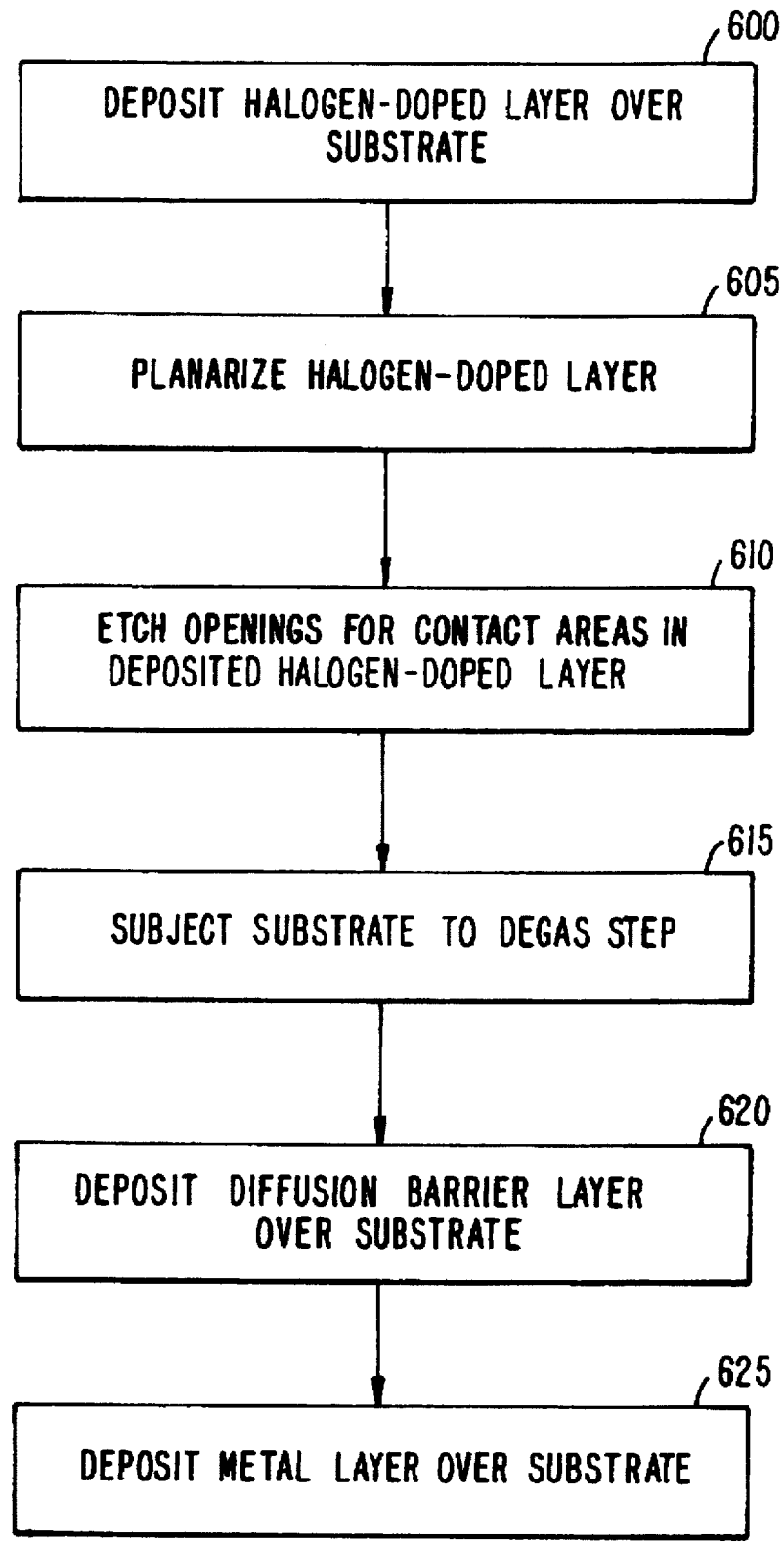
FIG. 6 is a flowchart illustrating steps undertaken in the formation of a metal interconnect layer according to one embodiment of the method of the present invention.

FIG. 6 is a flowchart showing the degassing step of the present invention along with other process sequence steps that may occur before and after the degassing step. As with the exemplary processes discussed with respect to FIG. 3, the steps shown in FIG. 6 can be executed in response to instructions of a computer program executed by processor 34. In FIG. 6, an FSG layer or similar halogen-doped layer is deposited over a wafer (step 600). Before deposition of the halogen-doped layer, the wafer is subject to multiple processing steps to form active devices and other structures as understood by a person of ordinary skill in the art.

After deposition, the halogen-doped layer is planarized (step 605) in preparation for deposition of overlying layers. The planarization process can include a chemical mechanical polishing (CMP), etching or a similar process. Once the halogen-doped dielectric layer is planarized, openings for contacts between layers overlying and underlying the dielectric layer are etched (step 610).

The wafer is then subjected to a degassing step (step 615) to remove loosely bonded halogen atoms and to stabilize the layers. In the degassing step, the wafer is heated to a temperature of between 300° and 550° C. for between about 30 to 120 seconds. Preferably, the degassing step takes place in a vacuum of between $1\times10^{-7}$ and $1\times10^{-4}$ torr.

It is important that the degassing step not use temperatures above a level that could cause damage to any underlying metal layers. It is also important that the degassing step be relatively brief. Too long a heat treatment can cause even strongly bonded halogen atoms to outgas from the film resulting in a film having a lower than desired halogen concentration. The optimal length of a degassing step depends on the temperature to which the wafer is heated. A higher temperature lessens the time required to remove the loosely bonded halogen atoms. The optimal length of the degassing step also depends on a number of factors including the halogen concentration level of the film, film thickness and the deposition process among others. For many films used in IMD layers that are between 0.5 and 3.0 microns thick, it is believed that a degassing step that heats the wafer to a temperature of between 300° and 550° C. for between about 30 and 120 seconds is preferred. For some layers it is even more preferable that the wafer be heated to a temperature between about 300°–450° C. and/or heated for a period of between 35 to 50 seconds.

Next, a diffusion barrier layer such as titanium, tungsten, titanium nitride or a similar material, or a combination of such materials (e.g., separate titanium and titanium nitride layers) is deposited (step 620) to prevent diffusion of silicon into an overlying metal or other layer and/or to improve film adhesion. Preferably, the diffusion barrier layer is between about 50 and 200 Å thick. Finally, a metal layer such as aluminum is deposited over the diffusion barrier layer (step 625). Preferably, the metal layer is about 6,000 and 10,000 Å thick.

The degassing step can take place in the same chamber as the deposition step or in a different chamber. Additionally, it is possible for the degassing step to be done shortly after deposition is completed (step 600) and before the planarization and etching steps (steps 605 and 610). In this sequence, the degassing step may be done in an in situ process so that the wafer is not exposed to ambient conditions such that the film could absorb moisture from the ambient before the degassing step. In one embodiment, such an in situ process occurs in a cluster tool system such as the one described above. In this embodiment, the wafer is transferred under vacuum conditions from the deposition chamber to a separate, dedicated heat treatment chamber in the cluster tool, such as chamber 230, for the degassing step. In another embodiment, a halogen-doped layer is deposited in a chamber in one cluster tool system, such as a P5000 reactor system manufactured by Applied Materials, and then transferred from that cluster tool system to another cluster tool system, such as an Endura PVD system manufactured by Applied Materials, for the degassing step and deposition of the overlying diffusion barrier layers and metal layers.

V. Exemplary Structure

Figure 7:
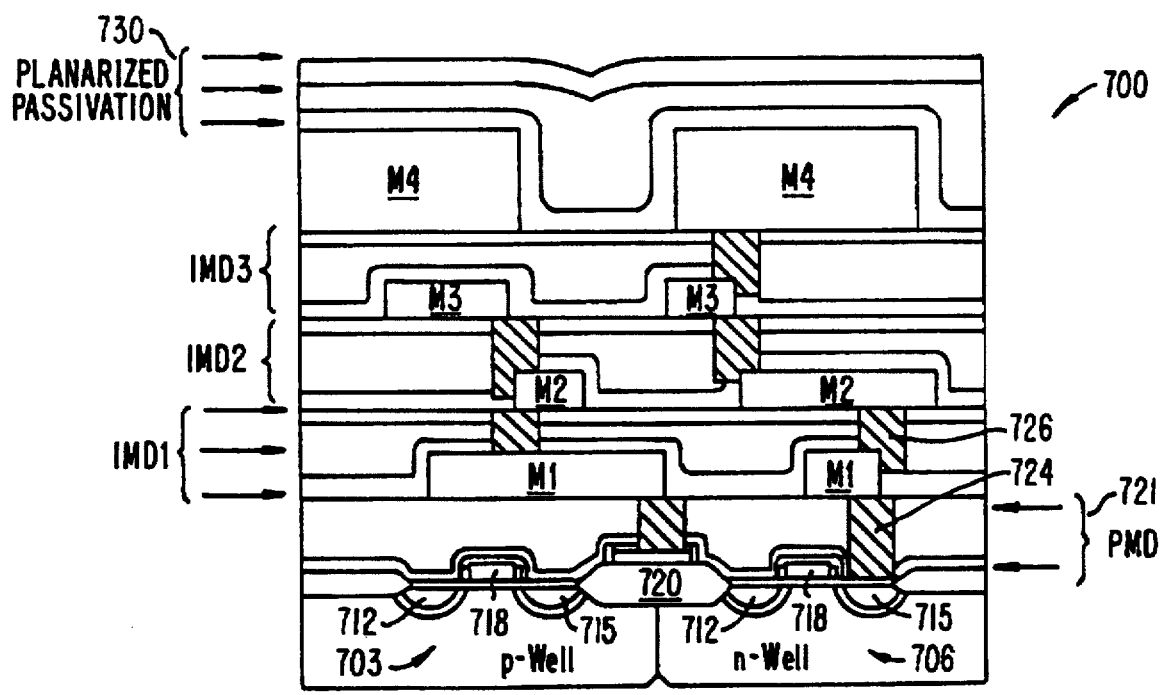
FIG. 7 is a simplified cross-sectional view of a semiconductor device manufactured according to the method of the present invention.

FIG. 7 illustrates a simplified cross-sectional view of a CMOS integrated circuit 700 according to the present invention. As shown, integrated circuit 700 includes NMOS and PMOS transistors 703 and 706, which are separated and electrically isolated from each other by a field oxide region 720. Each transistor 703 and 706 comprises a source region 712, a drain region 715 and a gate region 718.

A premetal dielectric layer 721 separates transistors 703 and 706 from metal layer M1 with connections between metal layer M1 and the transistors made by contacts 724. Metal layer M1 is one of four metal layers, M1–M4, included in integrated circuit 700. Each metal layer M1–M4 is separated from adjacent metal layers by respective intermetal dielectric layers IMD1, IMD2 or IMD3. Adjacent metal layers are connected at selected openings by vias 726. Deposited over metal layer M4 are planarized passivation layers 730.

While the present invention may find uses to treat and stabilize each of the dielectric layers shown in integrated circuit 700, it is particularly useful in treating halogen-doped IMD layers. Physical properties of such halogen-doped layers such as their low dielectric constant and good gap-fill properties, along with the PECVD process used in formation of the preferred embodiments make such halogen-doped films most useful as an insulation layer between adjacent metal layers as shown by IMD layers IMD1–IMD3. Typically, such IMD layers are between 0.2 and 3.0 microns thick.

The present invention may also be used in treating halogen-doped damascene layers which are included in some integrated circuits. In damascene layers, a blanket FSG layer is deposited over a substrate, selectively etched through and then filled with metal and etched back or polished to form metal layers such as M1. After the metal layer is deposited, a second blanket PSG deposition is performed and selectively etched. The etched areas are then filled with metal and etched back or polished to form vias 726.

It should be understood that the simplified integrated circuit 700 is for illustrative purposes only. One of ordinary skill in the art could implement the present method for fabrication of other integrated circuits such as microprocessors, application-specific integrated circuits (ASICS), memory devices, and the like. Additionally, the method of the present invention may be used in the fabrication of integrated circuits using technologies such as BiCMOS, NMOS, bipolar and others.

VI. Test Results and Measurements

To demonstrate the effectiveness of the present invention, experiments were performed measuring the outgassing of fluorine atoms from $C_2F_6$-FSG films subject to the degassing procedure described herein and films not subject to the procedure. In the experiments, a 2.0% $C_2F_6$-FSG thin film was formed on each wafer as described with respect to Table 1 above. The FSG films were deposited in a lamp-heated DCVD chamber outfitted for 150 mm wafers in a P5000 processing system manufactured by Applied Materials. After being deposited, the films were heated to a temperature of about 350° C. for varying time periods in a degassing step according to the present invention. One wafer was heated at 350° C. for approximately 30 seconds, while another wafer was heated for approximately 120 seconds. Tests were also performed heating other wafers for 40 and 60 seconds. The degassing step was performed in a degassing chamber of an Endura PVD processing system manufactured by Applied Materials.

After each degassing step, a 400 Å titanium layer was deposited over the substrate, and annealed. The anneal step heated the substrate to 550° C. for 2 minutes. Deposition of the titanium layer and the anneal step were also performed in appropriate chambers of the Endura PVD system.

The sheet resistivity of the titanium film was measured after the anneal, tabulated and compared to control samples of a $CF_6$-FSG film and an undoped silicon oxide film that were not subject to the degassing procedure. The results of these tests are summarized below in Table 3.

TABLE 3

EFFECT OF FSG DEGASSING ON Ti SHEET RESISTIVITY AFTER ANNEAL

| Film Type | Degas Step | Ti Deposition | Anneal | Post Anneal Sheet Res. ($\Omega/cm^2$) |
|---|---|---|---|---|
| 2.0% $C_2F_6$-FSG | ~350° C., 30 sec | 400 Å | 550° C. | 48.4 |
| 2.0% $C_2F_6$-FSG | ~350° C., 40 sec | 400 Å | 550° C. | 29.8 |
| 2.0% $C_2F_6$-FSG | ~350° C., 60 sec | 400 Å | 550° C. | 37.0 |
| 2.0% $C_2F_6$-FSG | ~350° C., 120 sec | 400 Å | 550° C. | 44.0 |
| 2.0% $C_2F_6$-FSG | None | 400 Å | 550° C. | 42.9 |
| Thermal Oxide | None | 400 Å | 550° C. | 36.4 |

As illustrated in Table 3, a degassing procedure at 350° C. for approximately 40 seconds produced optimal results for this $C_2F_6$-FSG film. The sheet resistivity of the titanium film overlying the FSG film subjected to such a degassing procedure was 29.8 ohms/$cm^2$. In contrast, the sheet resistivity of the titanium layer overlying the same 2.0% $C_2F_6$-FSG film not subjected to a degassing step was 42.9 ohms/$cm^2$. In fact, the 29.8 ohms/$cm^2$ sheet resistivity of the titanium film for the 40-second degassing step wafer was lower than the sheet resistivity of the titanium film overlying the USG film deposited for the test.

It is believed that the higher sheet resistivity of the titanium layer overlying the FSG layer subjected to a 30-second degassing step at 350 degrees was due to the length of the degassing step. It is believed that a 30-second degassing step at 350° C. for this form was not long enough to remove the loosely bonded fluorine atoms. Also, it is believed that the longer degassing steps of 60, and particularly 120 seconds, removed the loosely bonded fluorine atoms, but also adversely affected the more strongly bonded fluorine atoms. It is believed that the longer step either redistributed the fluorine within the film or created more loosely bonded fluorine atoms.

In additional tests, the effects of the degassing step were determined on the crystallinity and reflectivity of the overlying aluminum layer. In these experiments, a 2.0% $C_2F_6$-FSG film was formed on two separate wafers as described in Table 1 above. One of the wafers was subjected to a degassing step of the present invention where it was heated to a temperature of 350° C. for 40 seconds. The other wafer was not processed according to the method of the present invention.

Next, a 100 Å titanium layer was deposited over each wafer and a 6000 Å aluminum layer was deposited over that. Tests were then performed comparing the crystallinity and reflectivity of the aluminum film deposited over FSG films treated according to the present invention to the crystallinity and reflectivity of the other film.

Crystallinity was determined by X-ray defraction spectrum (XRD) data using Bragg's angle to measure the full-width, half-max (FWHM) of the XRD rocking curve data as is well known to those of ordinary skill in the art. This test provides an indication of the degree of crystallinity of the aluminum film and the grain size of the film. A smaller FWHM indicates a larger grain size and a higher degree of crystallinity, both of which are preferred characteristics of aluminum films. The results of these measurements are summarized below in Table 4 along with the reflectivity of the aluminum layer which is expressed as a percent of the reflectivity of silicon. A higher reflectivity is preferred for easier and better line definitions of the aluminum.

TABLE 4

EFFECTS OF FSG DEGASSING AND Ti THICKNESS ON Al CRYSTALLINITY AND REFLECTIVITY

| Film Type | Degas | Ti Deposition | Ti Deposition | Al XRD FWHM | Al Reflectivity |
|---|---|---|---|---|---|
| 2.0% $C_2F_6$-FSG | None | 100 Å | 6000 Å | 2.15° | 190.5% |
| 2.0% $C_2F_6$-FSG | ~350° C., 40 sec | 100 Å | 6000 Å | 0.90° | 202.5% |

As is evident from Table 4, the aluminum layer deposited over the FSG layer subjected to the degassing step of the present invention and the 100 Å thick titanium film exhibited distinctly better crystallinity and reflectivity properties than the aluminum layer deposited over the FSG film not treated according to the present invention and similar 100 Å thick titanium film.

Figure 8A:
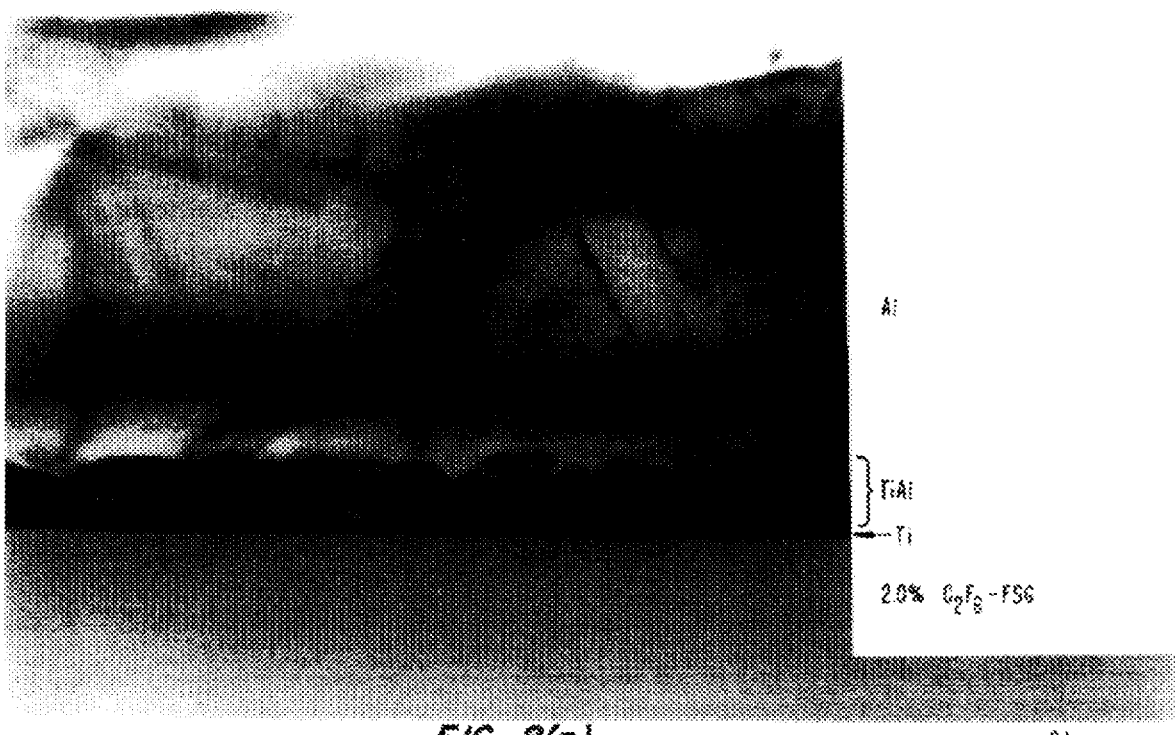
FIG. 8(a) is a cross-sectional micrograph of integrated circuits having aluminum and titanium layers overlying an FSG layer not processed according to the present invention.

In further tests, TEM micrographs were taken of a wafer having a 2.0% $C_2F_6$-FSG film deposited according to the process set forth in Table 1 but not treated by the degassing step of the present invention and a similar 2.0% $C_2F_6$-FSG film that was treated to a 40-second degassing step at 350° C. The micrographs were taken after deposition of a 400 Å titanium layer and a 6000 Å aluminum layer. These micrographs are shown as FIGS. 8(a) and 8(b), respectively. In FIG. 8(a), grain boundaries can be seen throughout the aluminum layer deposited over the titanium barrier layer. The grain boundaries are primarily due to the small grain size of the aluminum film that is believed to result from fluorine migration into the film.

Figure 8B:
FIG. 8(b) is a cross-sectional micrograph of integrated circuits having aluminum and titanium layers overlying an FSG layer processed according to the present invention.

The structure depicted in FIG. 8(b), on the other hand, has fewer grain boundaries in the aluminum layer and a larger grain size. The larger grain size results in better electromigration characteristics. It is believed that the degassing step of the present invention substantially prevented fluorine atoms from outgassing into and through the aluminum layer.

Several embodiments of the present invention having been fully described, many other equivalent or alternative methods of depositing the low dielectric constant oxide layer according to the present invention will be apparent to those skilled in the art. These alternatives and equivalents are intended to be included within the scope of the present invention.

What is claimed is:

1. A method for stabilizing a fluorosilicate glass layer deposited over a substrate, said method comprising the steps of:

heating said substrate to a temperature of between 300° to 550° C. for a period of between 30 and 120 seconds after said fluorosilicate glass layer is deposited.

2. The method of claim 1 wherein said substrate is heated to a temperature of between 300° and 450° C. for between 30 and about 55 seconds.

3. The method of claim 1 wherein said heating step occurs before said deposited halogen-doped layer is exposed to ambient conditions.

4. A method for stabilizing a fluorosilicate glass layer deposited over a substrate, said method comprising the step of:

(a) heating said substrate to a temperature of between 300° to 550° C. for a period of between about 30 and 55 seconds after said fluorosilicate glass layer is deposited.

5. The method of claim 4 wherein said fluorosilicate glass layer is deposited from a plasma of a process gas comprising a fluorine source selected from the group consisting of $C_2F_6$, triethoxyfluorosilane or $SiF_4$.

6. The method of claim 4 wherein said process gas further comprises tetraethoxysilane.

7. The method of claim 4 further comprising the step of:

(b) after step (a), depositing a diffusion barrier layer over said fluorosilicate glass layer; and (c) after step (b), depositing a metal layer over said diffusion barrier layer.

8. A method of fabricating an integrated circuit on a substrate said method comprising the steps of:

(a) depositing a halogen-doped dielectric layer over said substrate;

(b) thereafter, heating said substrate to a temperature of between 300° to 550° C. for a period of between 30 and 55 seconds; and (c) after step (b), depositing a metal layer over said halogen-doped dielectric layer.

9. The method of claim 8 further comprising the step of:

(d) between steps (b) and (c), depositing a diffusion barrier layer over said halogen-doped layer.

10. The method of claim 9 further comprising the steps of, between steps (a) and (d):

planarizing said halogen-doped layer; and etching contact openings in said halogen-doped layer so that said metal layer can be electrically coupled to either said substrate or to an underlying metal layer.

11. The method of claim 10 wherein said halogen-doped layer is a fluorosilicate glass layer.

12. The method of claim 11 wherein said substrate is heated to a temperature of between 300° and 450° C. during step (b).

13. The method of claim 11 wherein said diffusion barrier layer is less than about 200 Å thick and said metal layer is an aluminum layer less than about 10,000 Å thick.

14. The method of claim 13 wherein said fluorosilicate glass layer is less than about 3.0 microns thick.

15. An integrated circuit fabricated according to the method of claim 8.

16. A method for depositing a dielectric layer over a substrate, said method comprising the steps of:

(a) forming a halogen-doped silicon oxide layer over the substrate;

(b) heating the substrate to a temperature of between about 300° and 550° C. for less than about 120 seconds after said halogen-doped silicon oxide layer is deposited;

(c) after step (b), depositing a diffusion barrier layer over said halogen-doped silicon oxide layer; and (d) after step (c), depositing a metal layer over said diffusion barrier layer.

17. An integrated circuit fabricated according to the method of claim 16.

18. The method of claim 16 wherein said halogen-doped silicon oxide layer comprises a fluorosilicate glass layer.

* * * * *